United States Patent
Jacobs et al.

(10) Patent No.: US 6,785,189 B2
(45) Date of Patent: Aug. 31, 2004

(54) METHOD AND APPARATUS FOR IMPROVING NOISE IMMUNITY IN A DDR SDRAM SYSTEM

(75) Inventors: George M. Jacobs, Shirley, MA (US); James A. Duda, Waltham, MA (US)

(73) Assignee: Emulex Design & Manufacturing Corporation, Costa Mesa, CA (US)

( * ) Notice: Subject to any disclaimer, the term of this patent is extended or adjusted under 35 U.S.C. 154(b) by 0 days.

(21) Appl. No.: 10/245,437

(22) Filed: Sep. 16, 2002

(65) Prior Publication Data

US 2004/0052151 A1 Mar. 18, 2004

(51) Int. Cl.[7] .............................. G11C 7/22; G11C 7/02
(52) U.S. Cl. ...................... 365/233; 365/194; 365/195; 365/206
(58) Field of Search ................... 365/233, 194, 365/195, 206

(56) References Cited

U.S. PATENT DOCUMENTS

| 6,459,651 B1 | * | 10/2002 | Lee et al. .................... 365/233 |
| 6,600,681 B1 | * | 7/2003 | Korger et al. ............... 365/193 |
| 2003/0070052 A1 | * | 4/2003 | Lai ............................ 711/167 |

* cited by examiner

Primary Examiner—Van Thu Nguyen
Assistant Examiner—J. H. Hur
(74) Attorney, Agent, or Firm—Morrison & Foerster LLP

(57) ABSTRACT

In a memory controller for use with a DDR SDRAM, an apparatus improves the immunity of the controller to noise glitches on the DQS signal provided by the DDR SDRAM during READ operations. A method adjusts the noise immunity provided by the apparatus. In particular DQS quality circuits frame the DQS signal for a predetermined portion of the READ operation.

6 Claims, 1 Drawing Sheet

METHOD AND APPARATUS FOR IMPROVING NOISE IMMUNITY IN A DDR SDRAM SYSTEM

BACKGROUND OF THE INVENTION

1. Technical Field

The present invention relates generally to synchronous, dynamic random access memories ("SDRAMs"), and, in particular, to double data rate ("DDR") SDRAMs.

2. Background Art

In general, in the descriptions that follow, we will italicize the first occurrence of each special term of art which should be familiar to those skilled in the art of DRAMs, and, in particular, DDR DRAMs. In addition, when we first introduce a term that we believe to be new or that we will use in a context that we believe to be new, we will bold the term and provide the definition that we intend to apply to that term. From time to time, throughout this description, we will use the terms assert and negate when referring to the rendering of a signal, signal flag, status bit, or similar apparatus into its logically true or logically false state, respectively. We may also use the term High-Z to refer to a signal that is allowed to float between the power rails, with or without external termination to provide an appropriate bias voltage. Furthermore, although we may refer to the electrical interface structures of integrated circuit devices or chips as pins, we recognize that other chip packaging technologies may employ equivalent, alternative structures, such as solder balls (in ball grid arrays and the like), or wire bonds (for multi-chip modules and the like). Likewise, although we may refer to the chip mounting structure as a printed circuit board ("PCB"), we recognize that other multi-chip mounting technologies may employ equivalent, alternative structures, such as flexible substrates or, again, multi-chip modules. Accordingly, unless we expressly indicate to the contrary, we will use such terms generically, intending those terms to encompass all such current and future equivalent technologies.

The JEDEC Solid State Technology Association ("JEDEC") is the semiconductor engineering standardization body of the Electronic Industries Alliance ("EIA"). Among the many standards specified by JEDEC is one for DDR SDRAMs (the "Standard"). In general, the Standard defines the signaling protocol for the exchange of data between a memory controller and a DDR SDRAM. During each such exchange, the device that is attempting to transmit data (the "transmitter") is required to transmit, along with the data itself, a data strobe ("DQS") to facilitate the capture of that data by the device that is attempting to receive the data (the "receiver"). According to the Standard, from the perspective of the DDR SDRAM, input (i.e., "WRITE") data is registered on both edges of DQS and output (i.e., "READ") data is referenced to both edges of DQS. For example, during a WRITE operation, the memory controller is the transmitter and must transmit the DQS strobe to the DDR SDRAM so as to be center-aligned with the data. In contrast, during a READ operation, the DDR SDRAM is the transmitter and must transmit the DQS strobe to the memory controller so as to be edge-aligned with the data. Thus, it is the responsibility of the memory controller to generate DQS for all WRITEs and to recover DQS for all READs, while it is the responsibility of the DDR SDRAM to generate DQS for all READs and to recover DQS for all WRITEs.

The Standard further specifies the use of SSTL_2 Class I/II compatible signaling (as specified in another JEDEC standard). As is commonly known, SSTL_2 signaling requires some form of external termination to bias external input/output signals ("I/Os") to the system reference voltage ("Vref") of 1.25 Volts. Inherent in the use of such a relatively low reference voltage is reduced noise immunity. While it is certainly possible to design a DDR SDRAM system which will perform reliably for these conditions, it is often the case that tradeoffs are made for cost or other reasons that tend to have adverse effects in terms of system noise performance.

Since the primary function of the DQS signal is as control strobe for data transfer transactions, the Standard specifies that DQS, when not in use, may be allowed to go High-Z. Since it is possible, when in this state, for DQS to experience spurious, noise-induced transitions towards one or the other of the power rails, the Standard requires the transmitter to prepend a preamble to the initial assertion of DQS of a transfer operation, during which time DQS is negated. Thus, for example, for a burst transfer operation, the preamble must be provided for only the first assertion of DQS, but not for the subsequent assertions in the burst. Similarly, to prepare DQS for going High-Z at the end of a transfer operation, the transmitter is required to append a postamble, during which time DQS is again negated.

In normal operation, the memory controller can initiate a READ operation by issuing to the DDR SDRAM a READ command. In response, the DDR SDRAM will retrieve a predetermined portion of the data stored therein beginning at the particular address specified in the READ command. When ready to transmit the retrieved data, the DDR SDRAM will first generate the DQS preamble, then transmit the data, edge-aligned with both the rising and falling edges of DQS, and, finally, generate the DQS postamble. This sequence, however, is a bit problematic from the point of view of the memory controller: if, after issuing the READ command and before the DDR SDRAM generates the DQS preamble, a noise glitch occurs on DQS, first driving it low then driving it high, it is possible for the memory controller to mistakenly interpret the glitch as the real DQS, and thus react prematurely and capture garbage (and, concomitantly, miss the actual data). Notwithstanding the care taken by JEDEC to address system issues such as this, we submit that this particular problem will become increasingly more intractable as system clock rates rise in subsequent generations of DDR devices. Given the inherent difficulty in coordinating two electronic circuits physically located on separate chips, e.g., the DDR SDRAM and the memory controller, there may be no completely satisfactory solution for such inter-chip transactions, short of using the sophisticated mixed-signal clock forwarding/recovery techniques common in high-speed telecommunication devices. We submit that, at least until the operating speeds of DDR SDRAMs absolutely require such exotic (and expensive) technology, a simpler, less expensive solution is needed for improving the noise immunity of systems having DDR SDRAMs.

BRIEF DESCRIPTION OF THE SEVERAL VIEWS OF THE DRAWINGS

Our invention may be more fully understood by a description of certain preferred embodiments in conjunction with the attached drawings in which.

DETAILED DESCRIPTION OF THE INVENTION

Figure 1:
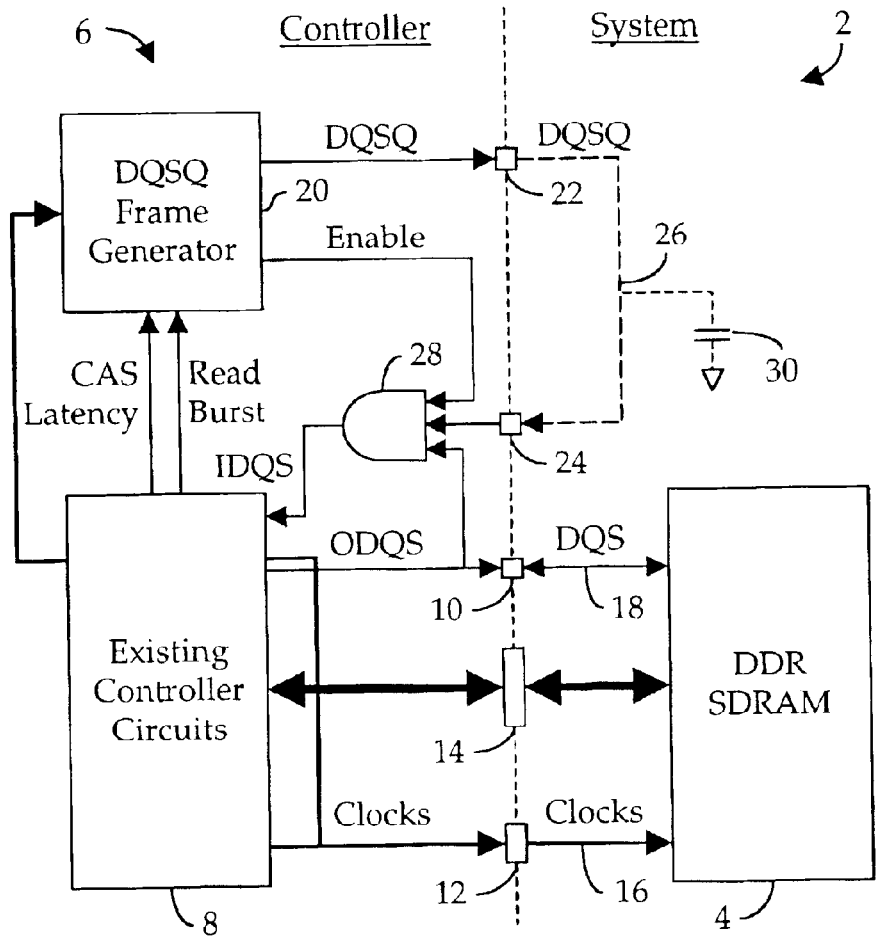
FIG. 1 is a block representation of an apparatus for improving the noise immunity of DDR SDRAMs constructed in accordance with the preferred embodiment of our invention.

Shown in FIG. 1 is a DDR SDRAM system 2 which includes a conventional DDR SDRAM 4 and a memory controller 6 which has been specially modified in accordance with the preferred embodiment of our invention to have significantly improved immunity to noise on the DQS signal during a READ operation. In the memory controller 6, the existing controller circuits 8 perform as in a conventional memory controller, with the exception of the circuitry responsible for recovering the DQS signal generated by the DDR SDRAM 4 during a READ operation. Thus, in a WRITE operation, our memory controller 6 operates substantially identically to a conventional memory controller, with the output version of the DQS signal ("ODQS") being generated normally by the controller circuits 8 and output to the DDR SDRAM 4 via an existing, bi-directional DQS pin 10 of the package containing the integrated circuit chip embodying the memory controller 6. The controller circuits 8 also operate normally in the WRITE operation to provide the necessary clocks, via existing clock pins 12, and all other control and data signals, via existing control and data pins 14. According to the Standard, every DDR SDRAM 4 must contain a "DLL" to phase lock its internal clocks to the clocks provided by the controller circuits 8 via the clock pins 12. Thus, for example, during a READ operation, the DDR SDRAM 4 will generate both the DQS signal and the data bits themselves so as to be phase-aligned with the clocks provided by the memory controller 6.

In a READ operation, the controller circuits 8 generate the READ command in the conventional manner as described above. Depending upon the specific type of READ operation requested, the controller circuits 8 are able to predict the number of cycles of latency (referred to in the Standard as "CAS latency") before the DDR SDRAM 4 can be expected to generate the DQS preamble. Thus, from a system perspective, the time delay between the initiation of the READ operation and the start of the DQS preamble is a function of (1) the latency specified by the Standard, (2) the delay induced by the various circuits used to implement the memory controller 6, and, in particular, the input and output drivers associated with the chip pins, (3) the time the clock signals take to transit the external clock trace 16, and (4) the time the DQS signal takes to transit the external DQS trace 18. In particular, from a noise immunity perspective, the period of ambiguity with respect to the DQS signal is a direct function of the lengths (and, to a lesser extent, the layout) on PCB of the clock trace 16 and the DQS trace 18. A primary objective of our invention is to minimize this period of ambiguity and thus improve the immunity of the memory controller 6 to noise on the DQS signal in the period of time following the end of one operation and the start of a succeeding READ operation.

As shown in FIG. 1, we have added to the memory controller 6 a DQSQ frame generator circuit 20 adapted to generate a DSQ frame during that portion of the READ operation in which the state of the DQS signal is expected to be valid. In particular, we have designed the generator circuit 20 so as to generate a DQS qualifier signal ("DQSQ") to selectively qualify the DQS signal received from the DDR SDRAM 4 via the DQS pin 10 during the READ operation. In addition, we have added a new DQSQ output pin 22 and a new DQSQ input pin 24 to the existing, standard pins of the memory controller 6. External to the memory controller 6, we connect the DQSQ output pin 22 to the DQSQ input pin 24 via a PCB trace 26 having a predetermined length which is function of the physical configuration of the system 2; we will describe below the method we prefer to use to determine this length. A 3-input AND gate 28 is adapted to receive the DQS signal, the DQSQ signal and an enable signal asserted by the generator circuit 20 substantially simultaneously with the generation of the DQSQ signal and negated upon the negation of any one of the DQS, DQSQ, or enable signals.

During a READ operation, the controller circuits 8 will operate normally to provide the necessary clocks, via the clock pins 12, and all other control and data signals, via the control and data pins 14. During system initialization, the controller circuits 8 will internally provide a CAS latency signal to the generator circuit 20 to inform the latter of the expected CAS latency. Upon initiating each READ operation, the controller circuits 8 will assert a read burst ("Read Burst") signal. In response to the assertion of the read burst signal, the generator circuit 20 will delay for a time period substantially equal to the expected CAS latency and then generate, substantially simultaneously, both the enable and DQSQ signals. The DQSQ signal will proceed to transit first the DQSQ output pin 22, then the external trace 26, and finally the DQSQ input pin 24. In response to simultaneously receiving (1) the enable signal from the generator circuit 20, (2) the DQSQ signal received via the DQSQ input pin 24, and (3) the DQS signal received via the DQS pin 10, AND gate 28 generates and forwards to the controller circuits 8 an input version of the DQS signal ("IDQS") representing the DQS signal as qualified by both the enable and DQSQ signals. In effect, AND gate 28 acts to regenerate the leading edge of the DQS signal at the proper time in the event that the actual assertion of the DQS signal by the DDR SDRAM 4 is hidden or swamped out by a positive-going noise pulse.

The controller circuits 8 respond to the IDQS signal in the same manner as a conventional memory controller would respond to receiving the external version of the DQS signal directly from the DQS pin 10. At the end of the last burst cycle, the controller circuits 8 will negate the read burst signal to the generator circuit 20 to inform the latter that the READ operation is complete. In response, the generator circuit 20 will negate the enable signal (thus disabling the AND gate 28) and let the DQSQ signal go High-Z.

As noted above, the period of ambiguity ("$T_{AMBIGUITY}$") between the initiation of the READ operation and the start of the DQS preamble can be expected to be no less than the total of four different components: (1) the latency specified by the Standard ("$T_{LATENCY}$"), (2) the delay induced by the various circuits used to implement the memory controller 6, and, in particular, the input and output drivers associated with the chip pins ("$T_{CIRCUITS}$"), (3) the time the clock signals take to transit the external clock trace 16 ("$T_{CLOCK}$"), and (4) the time the DQS signal takes to transit the external DQS trace 18 ("$T_{DQS}$"). In general, the sum of all four components represents the time phase difference or skew between the operation of the circuits comprising the memory controller 6 and those comprising the DDR SDRAM 4. Our primary objective is to employ the AND gate 28 to mask all externally-induced noise glitches that may occur on the DQS trace 18 during $T_{AMBIGUITY}$. To compensate for $T_{LATENCY}$, we have adapted the memory controller 6 to delay the assertion of the enable and DQSQ signals until the end of the number of clock cycles indicated by the CAS latency signal; in effect, we use the enable signal to totally mask any noise glitches on the DQS trace 18 during $T_{LATENCY}$. $T_{CIRCUITS}$ is automatically compensated for since, for any given piece of silicon, the delays through the clock, DQSQ and DQSQ drivers will tend to closely track over process, voltage and temperature. To compensate for $T_{CLOCK}$ and $T_{DQS}$, we select the length of the trace 26 so as to provide substantially the same impedance to the DQSQ signal as the total of the impedances of the clock trace 16 and the DQS trace 18 to the clocks and DQS signals, respectively; thus, we use the DQSQ signal to mask all noise glitches on the DQS trace 18 from the end of $T_{LATENCY}$ until the clocks have had sufficient time to reach the DDR SDRAM 4 and the DQS signal has had sufficient time to return from the DDR SDRAM 4. Since the DDR SDRAM 4 is physically incapable of generating the DQS signal the instant that it receives the respective clocks, we recommend slightly increasing the impedance of the trace 26 to accommodate for realistic circuit responsiveness.

Figure 2:
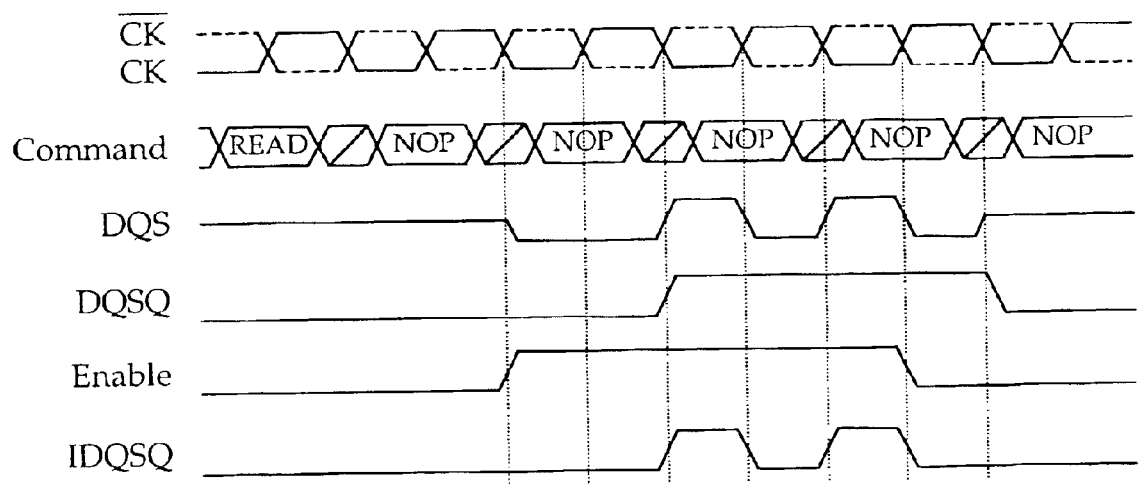
FIG. 2 is a timing diagram illustrating the operation of the apparatus shown in FIG. 1.

As shown in FIG. 2, AND gate 28 is adapted to affect primarily the first rising edge of the DQS signal from the DDR SDRAM 4. In the event the DQSQ signal returns before the DQS signal from the DDR SDRAM 4, the first IDQS rising edge will result from the rising edge of DQS. Alternatively, if the DQSQ signal returns after the DQS signal from the DDR SDRAM 4, the first IDQS rising edge will result from the rising edge of DQSQ instead. In sum, we use the DQSQ signal to generate a frame in time where DQS from the external DDR SDRAM 4 can be safely sampled, taking into account variations in process, voltage, temperature, and PCB impedance, and thereby effectively mask out noise glitches.

If desired, you can use conventional system analysis tools, such as logic analyzers and the like, to empirically determine the optimum impedance for the trace 26 for each particular PCB instantiation of your system. In some applications, it may be desirable to increase the impedance of the trace 26 by adding a capacitor 30. In general, the more precisely you can replicate the actual $T_{AMBIGUITY}$ the more immune your system will be to noise glitches on the DQS trace 18.

Thus it is apparent that we have provided a method and apparatus for improving the noise immunity of a DDR SDRAM system. In particular, we have disclosed a memory controller specially adapted to frame the DQS signal during that portion of the READ operation in which the state of the DQS signal is expected to be active, thereby improving the immunity of the system. Alternatively, our invention can be viewed as masking, or blocking, or qualifying (or any alternative term of similar import) the DQS signal during that portion of the READ operation in which the state of the DQS signal may be ambiguous. Further, we have disclosed a method for adjusting the system noise immunity by appropriate selection of certain operating characteristics of the memory controller. In particular, we have disclosed a method for adjusting the period of time during which the DQS signal is masked. Those skilled in the art will recognize that modifications and variations can be made without departing from the spirit of our invention. Therefore, we intend that our invention encompass all such variations and modifications as fall within the scope of the appended claims.

What we claim is:

1. A memory controller adapted for use on a printed circuit board ("PCB") with a double data rate synchronous dynamic random access memory ("DDR SDRAM"), the memory controller comprising:

control circuits to provide to the DDR SDRAM, during a READ operation, a clock signal, and to receive from the DDR SDRAM, during said READ operation, a DQS signal; and DQS qualifying circuits to frame the DQS signal for a predetermined portion of the READ operation to generate a framed DOS signal, the DOS qualifying circuits including a DQSQ frame generator circuit that, in response to an assertion of a read burst signal from the control circuits, provides a DOS Qualifier signal that is delayed from the assertion of the read burst signal by an amount of time based on a CAS latency signal, wherein the DOS Qualifier signal is provided from the memory controller to an input to a path on the PCB and then received by the memory controller from an output of the path on the PCB as a further delayed DOS qualifier signal, the memory controller further including circuitry to couple the output of the path on the PCB to the control circuits, to provide the further delayed DOS qualifier signal to the control circuits for generating the framed DOS signal.

2. The memory controller of claim 1 wherein:

the READ operation has a latency time that is at least partially predefined by a JDEC DDR SDRM standard; and the CAS latency signal is a function of the latency time predefined by the standard.

3. The memory controller of claim 2 wherein:

the clock signal is provided to the DDR SDRAM via a clock trace on said PCB;

the DQS signal is received from the DDR SDRAM via a DQS trace on said PCB; and the impedance of the path on the PCB is a function of the impedances of the clock trace and DQS trace.

4. The memory controller of claim 1 wherein:

the clock signal is provided to the DDR SDRAM via a clock trace on said PCB;

the DQS signal is received from the DDR SDRAM via a DQS trace on said PCB; and the impedance of the path on the PCB is a function of the impedances of the clock trace and DQS trace.

5. The memory controller of claim 1, wherein:

the DQS qualifying circuits are further to, in response to the assertion of the read burst signal from the control circuits, assert an enable signal delayed from the assertion of the read burst signal by an amount of time based on the CAS latency signal; and the circuitry to couple the output of the path on the PCB to the control circuits includes logic circuitry to prevent the framed DQS signal from being provided to the control circuits when the enable signal is not asserted.

6. The memory controller of claim 1, wherein:

the DQS qualifying circuits are further to, in response to the deassertion of the read burst signal, deassert the enable signal.

* * * * *